United States Patent [19]

Black

[11] 4,353,105
[45] Oct. 5, 1982

[54] CMOS LATCH-UP PROTECTION CIRCUIT

[75] Inventor: William C. Black, Berkeley, Calif.

[73] Assignee: National Semiconductor Corporation, Santa Clara, Calif.

[21] Appl. No.: 214,401

[22] Filed: Dec. 8, 1980

[51] Int. Cl.³ .............................................. H02H 9/04
[52] U.S. Cl. ................................ 361/101; 307/200 B; 361/58; 361/100
[58] Field of Search ................... 361/100, 101, 58, 91; 307/200 B

[56] References Cited

U.S. PATENT DOCUMENTS 3,781,608 12/1973 Geiger ................................. 361/100

Primary Examiner—Reinhard J. Eisenzopf
Attorney, Agent, or Firm—Gail W. Woodward; James A. Sheridan; Neil B. Schulte

[57] ABSTRACT

A protection circuit for bulk-silicon CMOS circuits detects the latch-up of parasitic SCR devices, current starves the CMOS circuit in response to detecting a SCR latch-up condition and reenables normal circuit operation once the latch-up condition has been terminated.

5 Claims, 5 Drawing Figures

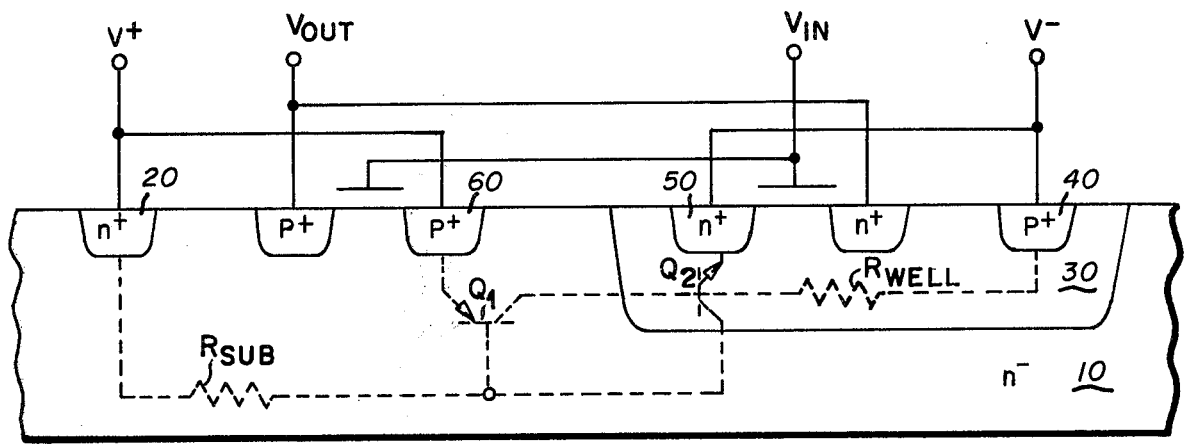
Fig_1
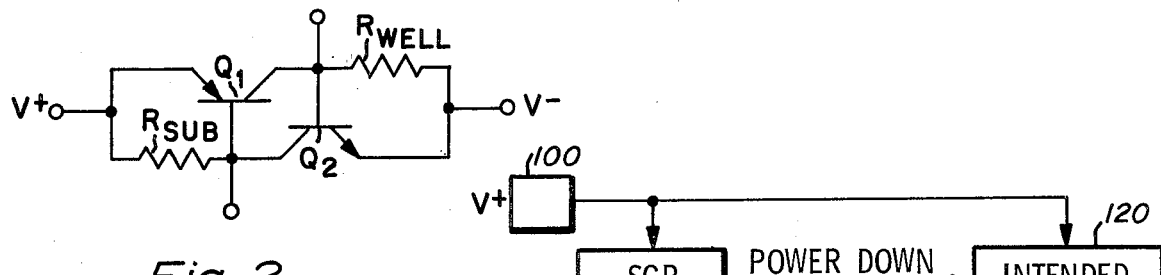
Fig_2
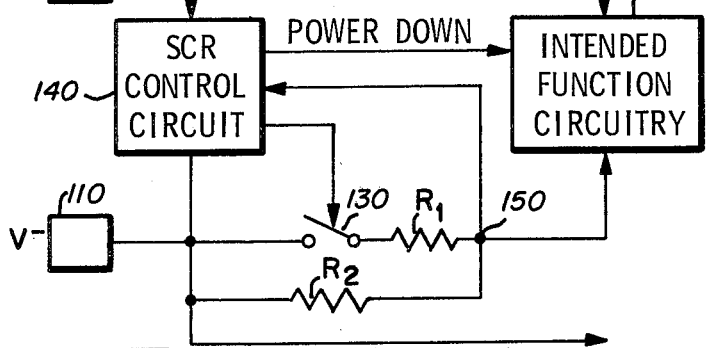
Fig_3
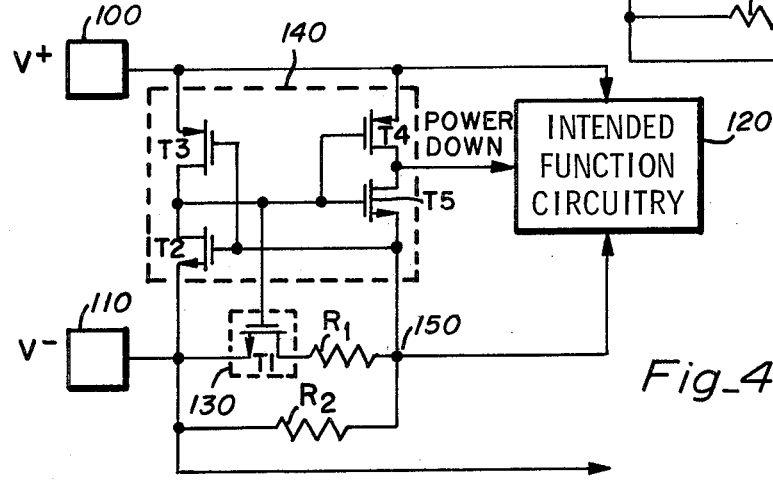
Fig_4
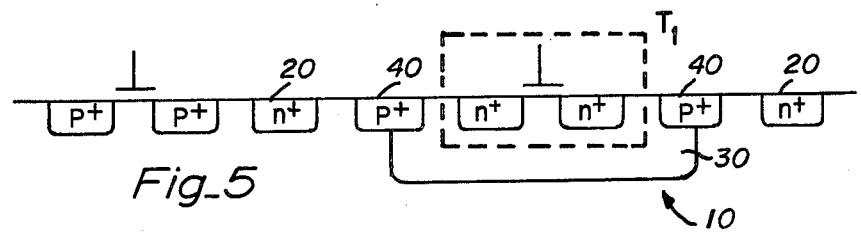
Fig_5

CMOS LATCH-UP PROTECTION CIRCUIT

BACKGROUND OF THE INVENTION

1. Field of the Invention

The present invention relates to a technique for protection of a CMOS circuit on bulk silicon from "latch-up" of intrinsic parasitic devices in the CMOS structure. More specifically, the present invention is related to a circuit for detecting the excess currents characteristic of latch-up of an intrinsic parasitic SCR device, terminating the latch-up condition by current starving the SCR device and re-establishing normal circuit operation after the latch-up condition has been terminated.

2. Background of the Invention

A common problem in CMOS circuits constructed on bulk silicon, and in many other triple diffused integrated circuits as well, is the disruption of normal circuit operation and possible destruction of the chip itself as a result of the latch-up of a parasitic SCR device. See for instance "Latch-up in CMOS Integrated Circuits" by B. L. Gregory and B. D. Shafer in the IEEE trans. NUCL sci., Volume NS-20, p. 293, 1973. A cross section of a typical CMOS circuit is illustrated in FIG. 1, which illustrates a pair of parasitic transistors in an SCR configuration inherent in the construction of this triple diffused CMOS structure. A detailed schematic diagram of the parasitic SCR circuit is illustrated in FIG. 2. Particularly, in typical CMOS circuits such as digital logic circuits, interconnects typically couple the base of parasitic device Q1 to the positive power supply V+ by coupling N− substrate 10 to the V+ power supply via N+ diffused region 20. The base of parasitic device Q2 is effectively coupled to the negative power supply V− by coupling the P− diffused region 30 to the negative power supply V− via P+ diffused region 40. These connections normally bias the parasitic SCR circuit off. Thus, unless a starting current is forced into the base of one of the parasitic devices, this parasitic SCR circuit will remain off. In normal circuit operation, this parasitic SCR is never intentionally activated. However, it is possible to unintentionally activate the SCR in a number of ways. Referring to the circuit schematic in FIG. 2 of the parasitic SCR, the inherent resistance of P− region 30 (known as the well) is modeled as resistor $R_{well}$ and the inherent resistance of N− substrate 10 is modeled as resistor $R_{sub}$. A current flowing in P− region 30 can cause a voltage to be established across the resistor $R_{well}$. If this voltage is sufficient to forward bias the junction between well 30 and N+ region 50, parasitic device Q2 is activated and draws current from N− substrate 10. If this current establishes a voltage drop across the resistor $R_{sub}$ sufficient to forward bias a junction between a P+ region 60 and N− substrate 10, parasitic transistor Q1 is activated. Transistor Q1 will supply excess current to the base of transistor Q2 and cause the parasitic SCR circuit to latch-up if the feedback current gain of the parasitic SCR circuit is greater than one. This latch-up may induce the latch-up of additional parasitic SCR devices in a CMOS circuit. The latch-up of one or more parasitic SCR devices provides a low impedance current path between the positive and negative power supplies which typically draws several amps of current. This latch-up current is often sufficient to cause the thermal destruction of a portion of the integrated circuit which may render the entire circuit inoperative.

SCR action may be initiated by the external overdriving of circuit nodes, device avalanche, photo-currents or internal charge pumping. Typically, SCR latch-up is often initiated during a power-up sequence of a CMOS circuit since the exact relationships between the power supplies and the inputs are not always carefully specified or controlled.

Conventionally, layout or process modifications have been used to decrease the probability of any of these mechanisms leading to the catastrophic latch-up of bulk CMOS circuits. However, these layout and process modifications involve either increased process complexity or decreased circuit density.

A number of different layout related techniques have been employed to prevent parasitic SCR action. For instance, the substrate and well contacts, regions 20 and 40 in FIG. 1, can be placed frequently on the chip to minimize accumulated voltage drops across inherent resistors to reduce the probability of forward biasing one of the parasitic junctions. Another method is to fully guard-band input protection diodes and output drivers to minimize the bi-polar action and to isolate internal circuits with series resistors whenever possible. Another method involves placing resistors in series with the supply lines which has the effect of increasing the required trigger voltage and current starving the SCR once it is triggered. However, this latter technique is not generally useful since many circuits such as output drivers require a low impedance supply voltage.

Process related techniques to minimize SCR action have also been employed. In one technique a buried layer is placed under portion of the chip to minimize the inherent IR voltage drops and to reduce the beta (B) of the parasitic bipolar transistors. In another technique a deep isolation diffusion is placed around the wells to reduce lateral bi-polar action. Another technique, taught by Dawes et al., in "Process Technology Radiation-Hardened CMOS Integrated Circuits" in the IEEE Journal of Solid State Circuits Vol SC-11, No. 4, August 1976, reduces the bulk carrier lifetime by gold doping the silicon substrate. This doping reduces the gain of the bi-polar devices, thus the likelihood of SCR latch-up. In another technique an insulating sapphire substrate eliminates the SCR circuit paths altogether.

However, many of these techniques merely reduce the probability of a catastrophic SCR latch-up occurring. Further, these techniques involve either additional complexity in the layout of the production process or limitations on circuit density.

BRIEF DESCRIPTION OF THE FIGURES

FIG. 1 is a cross-section of a typical bulk CMOS circuit illustrating a pair of parasitic transistors in an SCR configuration.

FIG. 2 is a detailed schematic diagram of the parasitic SCR circuit of FIG. 1.

FIG. 3 is a block diagram of the preferred embodiment of the present invention.

FIG. 4 is a detailed schematic diagram at the circuit at FIG. 3.

FIG. 5 is a cross-section illustration of transistor T1 and the associated latch-up protection regions.

SUMMARY OF THE INVENTION

A CMOS integrated circuit has a protection circuit coupled in series with the current path for detecting the excess currents characterizing the latch-up of an intrinsic parasitic SCR device. The protection circuit reduces the current to the CMOS integrated circuit in response to detecting an excess current and provides a high impedance current path to bias the circuit to a normal operating condition. Once the excess current has been reduced to a nominal level the protection circuit automatically reenables a normal current flow.

In one embodiment of the present invention the protection circuit provides a control signal to the CMOS integrated circuit in response to detecting a latch-up condition which places the CMOS integrated circuit in a low current stand-by mode. When the latch-up condition current flow are reenabled, normal circuit operation is reestablished by removing the control signal.

DETAIL DESCRIPTION OF THE PREFERRED EMBODIMENT

A block diagram of the preferred embodiment of the present invention is illustrated in FIG. 3. A positive voltage supply V+ is coupled to input terminal 100 and a negative voltage supply V− is coupled to input terminal 110. Preferably, the positive voltage supply V+ is approximately 5 to 12 volts and the negative voltage supply V− is approximately 0 to −5 volts. Input terminal 100 is coupled to intended function circuitry 120. For example, in the preferred embodiment the intended function circuitry is a telecommunications PCM filter. The negative power supply V− and input terminal 110 are not directly coupled to intended function circuitry 120 but instead selectively coupled through a semiconductor switch 130 and a series resistance R1 and coupled through a high-impedance parallel resistor R2.

Semiconductor switch 130 selectively opens and closes in response to a control signal from a control circuit 140. Control circuit 140 also provides a binary "power-down" control signal which is coupled to intended function circuitry 120 and causes intended function circuitry 120 to either function normally or to operate in a low-current standby mode by interrupting intended circuit paths between the positive and negative supplies in response to the power-down control signal. Thus, intended function circuitry 120 is adapted so as to selectively operate in a power-down state in response to the power-down signal from control circuit 140. Control circuit 140 is also coupled to input terminal 110 and terminal 150 for receiving voltage information related to the current flowing through intended function circuitry 120. In normal operation, intended function circuitry 120 draws a normal operating current which provides a normal operating voltage drop across semiconductor switch 130 and resistors R1 and R2. Typically this normal operating current is approximately 4 milliamps.

The latch-up of a parasitic SCR within intended function circuitry 120 typically results in a steady-state low impedance path between input terminal 100 and terminal 150 which causes an increase in the current flow through intended circuitry 120 and an increase in the voltage drop across input terminal 110 and terminal 150. If this voltage drops exceeds a designated threshold value $V_{th}$, control circuit 140 responds by switching off semiconductor switch 130 and applying a power-down signal to intended function circuitry 120. In the preferred illustrated embodiment of the present invention, Control circuit 140 is designed to open semiconductor switch 130 and generate a power-down signal in response to the current through resistor R1 exceeding approximately 40 or 50 milliamps. This eliminates the only low impedance current path to intended function circuit 120, reducing the current available to the parasitic SCR.

SCR's typically have a minimum holding current. When the current flow through the SCR falls to a value less than this holding current the parasitic SCR turns off. Typically, the SCR action terminates at a current of approximately 1-10 milliamps. The SCR latch-up condition terminates as a result of this "current starvation" which causes a drop in the voltages across the inherent resistances in the silicon substrate, resulting in the parasitic transistors becoming nonconductive. After the parasitic SCR condition terminates, the parasitic capacitances in intended function circuitry 120 are charged by the small current flowing through resistor R2 until the voltage drop between input terminal 110 and terminal 150 is again below the designated threshold value $V_{th}$. When this occurs, control circuit 140 again turns on semiconductor switch 130 and subsequently removes the power-down signal from intended function circuitry 140 resulting in the resumption of normal circuit operation.

A detailed schematic diagram of the circuit of FIG. 3 is provided in FIG. 4. A positive voltage supply V+ is applied to input terminal 100 and negative voltage supply V− is applied to input terminal 110. The positive voltage supply V+ and input terminal 100 are coupled directly to intended function circuitry 120. The negative voltage supply V− and input terminal 110 are selectively coupled to intended function circuitry 110 via an NMOS switch T1 in series with resistor R1 and via a high impedance parallel path through resistor R2.

The power-down control signal from control circuit 140 causes intended function circuitry 120 to operate normally when the power-down signal has a low value a (logical zero). When the power-down signal has a high value (a logical 1) intended function circuitry 120 switches to a low current state known as a power-down state. The negative supply terminal 150 of intended function circuitry is coupled to the gates of NMOS transistor T2, PMOS transistor T3 and to the source of NMOS transistor T5. During normal operation, intended function circuitry 120 draws a normal operating current through transistor T1 and resistor R1 which provides an operating voltage drop between input terminal 110 and terminal 150 of approximately 0.08 volts. If a parasitic SCR should latch-up within intended function circuitry 120, the increased current will cause an increase in the voltage drop between input terminal 110 and terminal 150 which will cause transistor T2 to turn on if the voltage drop exceeds the threshold voltage of transistor T2. Since the beta ratio of transistor T2 to T3 ($B_2/B_3$) is relatively high (greater than 10/1) the gate of transistor T1 is pulled low, turning device T1 off and stopping current flow through resistor R1. As transistor T2 turns on, the gates of transistors T4 and T5 are also pulled low which causes PMOS transistor T4 to turn on and NMOS transistor T5 to turn off pulling the power-down line to the high voltage level of power supply V+. If the beta ratio of transistor T4 to T5 ($B_4/B_5$) is approximately 5 to 10, the power-down line will go to a high voltage state rapidly in response to only a slight voltage variation on the gates of transistors T4 and T5. In the preferred embodiment, $B_4/B_5$ is fairly large (greater than 5/1) which ensures that transistor T1 will be turned on before the intended function circuitry 120 is reenabled. Thus, the power-down occurs before transistor T1 shuts off and transistor T1 turns on before the power-down signal is released.

When the cause of the increased current through intended function circuitry is removed, for instance, when an SCR latch-up condition terminates, residual capacitances present in the intended function circuitry are charged through resistor R2. In the present embodiment, this resistor has a significantly higher resistance than resistor R1, thus it does not provide a current path having a low enough impedance to sustain an SCR latch-up condition. Specifically, in the present environment, R1 is the intrinsic resistance of transistor T1 and has a value of approximately 20 to 25 ohms. Resistor R2 has a value of approximately 10 K ohms. The ratio of these resistances determines the dynamic operating range of the circuit. In the preferred embodiment, the threshold voltage of device T2 is one volt. If it is desired that the circuit shut off at an operating current of 50 or more milliamps, the ideal value for resistor R1 is 20 ohms. The value of resistor R2 determines the current at which the circuit will be reenabled. For instance, in the preferred embodiment, the present value of the 10 K ohm resistor R2 provides a one-volt threshold at terminal 150 when a current of approximately 100 microamps flows through the intended function circuitry. When the voltage drop between input terminal 110 and terminal 150 is again below the one-volt threshhold voltage of device T2, transistor T2 turns off, turning transistor T1 on and transistor T4 off. This recouples input terminal 110 to intended function circuitry 120 through resistor R1 and turns off transistor T4 causing the power-down signal to fall to a low logic level reenabling the intended function circuitry. Thus, intended function circuitry 120 will not be reenabled until current flow in the intended function circuitry 120 is less than 100 microamps. This value is sufficiently small to terminate any SCR latch-up condition in the intended function circuit, allowing it to be safely powered up.

By lowering the resistance of resistor R2, the current at which intended function circuitry 120 is re-enabled is raised. For example, if resistor R2 is equal to 2 K ohms, the intended function circuit will be re-enabled when the operating current attains a value less than approximately 0.5 milliamps.

In the preferred embodiment, transistor T1 is approximately 1000 to 5000 microns wide and 6 microns long. This device must be quite large and adapted to conduct all of the current required by intended function circuitry 120. It is especially important that transistor T1 not be involved in an SCR latch-up. FIG. 5 illustrates the precautions that have been taken to safe-guard against this type of latch-up. Particularly, transistor T1 is constructed in a P− well region 30 and is surrounded by P+ regions 40 which completely encircle transistor T1 to reduce current induced voltages in the well. Further, well region 30 is surrounded by N+ region 20 which completely encircles well region 30 and reduces current induced voltage drops in the nearby substrate 10.

Thus, in the preferred embodiment, it is not necessary to guardband the majority of the internal circuits. Further, it is not necessary to contact the wells or substrate as often to reduce current induced voltage drops which might activate an SCR latch-up condition.

While the invention has been particularly described with reference to the preferred embodiment, those versed in the art will appreciate that minor modifications in form and detail may be made without departing from the spirit and scope of the invention. Accordingly, all such modifications are embodied within the scope of this patent as properly come within any contribution to the art and are particularly pointed out by the following claims.

I claim:

1. A protection circuit for limiting the current flow in a current path comprising:
   a first resistance in the current path;
   series circuit means comprising a second resistance and a first MOS transistor, the series circuit means coupled in parallel with the first resistance, the first MOS transistor for selectively providing a current path through the series circuit means in response to a control signal and for interrupting the current path through the series circuit means otherwise;
   means for providing a first voltage and means for providing a second voltage wherein the first resistance has one terminal coupled to the means for providing said first voltage; and
   a first load having first and second terminals, the first terminal coupled to the means for providing a second voltage and the second terminal coupled to the other terminal of said first resistance said second terminal also being coupled to the gate of the first MOS transistor by way of a second MOS transistor acting as an inverter and wherein the first load means is coupled in series with said first resistance and coupled for applying the control signal to the first MOS transistor in response to the voltage across the first resistance being less than a threshold voltage and for not applying the control signal to the first MOS transistor otherwise.

2. A protection circuit as in claim 1 further comprising a second series circuit comprising a third MOS transistor in series with a second load, the second series circuit coupled between the means for providing the first voltage and the means for providing the second voltages, the gate of the third MOS transistor coupled to the second terminal of the first load.

3. A protection circuit as in claim 2 wherein the first, and second transistors and the second MOS load are NMOS transistors and the third MOS transistor and the first loads comprise PMOS transistors, the gate of the first load is coupled to the gate of the second MOS transistor and the gate of the second load coupled to the gate of the third MOS transistor.

4. A protection circuit as in claim 2 wherein the beta of the third MOS transistor is more than five times the beta of the second load.

5. A protection circuit as in claim 4 wherein the beta of the second MOS transistor is more than ten times the beta of the first load.

* * * * *